United States Patent
Terashima et al.

(10) Patent No.: US 6,828,169 B2
(45) Date of Patent: Dec. 7, 2004

(54) METHOD OF FORMING GROUP-III NITRIDE SEMICONDUCTOR LAYER ON A LIGHT-EMITTING DEVICE

(75) Inventors: Kazutaka Terashima, Hsinchu (TW); Mu-Jen Lai, Chuagli (TW); Chiung-Yu Chang, Taichung (TW)

(73) Assignee: Vetra Technology, Inc., Hsinchu (TW)

( * ) Notice: Subject to any disclaimer, the term of this patent is extended or adjusted under 35 U.S.C. 154(b) by 0 days.

(21) Appl. No.: 10/463,355

(22) Filed: Jun. 17, 2003

(65) Prior Publication Data

US 2003/0224548 A1 Dec. 4, 2003

Related U.S. Application Data

(63) Continuation-in-part of application No. 10/062,116, filed on Jan. 30, 2002.

(30) Foreign Application Priority Data

Sep. 11, 2002 (TW) ........................................ 91120763 A

(51) Int. Cl.[7] .............................................. H01L 21/00
(52) U.S. Cl. ............................ 438/22; 438/47; 438/520
(58) Field of Search .............................. 438/22, 29, 46, 438/47, 520, 522

(56) References Cited

U.S. PATENT DOCUMENTS

| | | | | |
|---|---|---|---|---|
| 6,531,716 B2 | * | 3/2003 | Udagawa | 257/94 |
| 2002/0197825 A1 | * | 12/2002 | Usui et al. | 438/459 |
| 2003/0216011 A1 | * | 11/2003 | Nakamura et al. | 438/478 |
| 2004/0023427 A1 | * | 2/2004 | Chua et al. | 438/47 |

* cited by examiner

Primary Examiner—Tuan H. Nguyen
(74) Attorney, Agent, or Firm—Thomas, Kayden, Horstemeyer & Risley

(57) ABSTRACT

A method of forming a group-III nitride semiconductor layer on a light-emitting device. First, a substrate is provided. Next, a buffer layer is formed on the substrate. A hydrogen treatment is performed on the buffer layer. Finally, a group-III nitride semiconductor layer is formed on the buffer layer. According to the present invention, a hydrogen treatment is performed on the buffer to prevent corrosion during subsequent process and remove particles from the buffer layer. Thus, the structure of the epitaxy layer following formed on the buffer layer is enhanced.

20 Claims, 3 Drawing Sheets

METHOD OF FORMING GROUP-III NITRIDE SEMICONDUCTOR LAYER ON A LIGHT-EMITTING DEVICE

This application is a continuation-in-part of U.S. patent application Ser. No. 10/062,116 filed Jan. 30, 2002.

BACKGROUND OF THE INVENTION

1. Field of the Invention

The present invention relates to a light emitting device, and in particular to forming a group-III nitride semiconductor layer thereon.

2. Description of the Related Art

A group-III nitride semiconductor light-emitting diode is fabricated by providing an electrode on a stacked layer structure having a pn-junction type light-emitting part comprising, for example, aluminum gallium indium nitride ($Al_xGa_yIn_{1-x-y}N$, where $0 \leq X$, $Y \leq 1$ and $0 \leq X+Y \leq 1$). In the stacked layer structure, a buffer layer is generally provided for relaxing lattice mismatch between the substrate material and the group-III nitride semiconductor layer constituting the stacked layer structure, thereby growing a high-quality group-III nitride semiconductor layer. Conventionally, for example, in the stacked layer structure for use in a light-emitting device using a sapphire ($\alpha$-$Al_2O_3$ single crystal) substrate, the buffer layer is exclusively composed of aluminum gallium nitride (compositional formula; $Al_\alpha Ga_\beta N$, where $0 \leq \alpha$, $\beta \leq 1$).

When a stacked layer structure uses an insulating material such as sapphire for the substrate, an electrode, namely, an ohmic electrode for supplying a device driving current to LED, comprising such a stacked layer structure is disposed on p-type and n-type conductive layers constituting the stacked layer structure.

In the unexamined published U.S. Pat. No. 2001/0,054, 717, Takashi discloses a high emission intensity group-III nitride semiconductor light-emitting device obtained by eliminating crystal lattice mismatch with substrate crystal and using a gallium nitride phosphide-based light emitting structure having excellent crystallinity. A gallium nitride phosphide-based multilayer light-emitting structure is formed on a substrate via a boron phosphide (BP)-based buffer layer. The boron phosphide-based buffer layer is preferably grown at a low temperature and rendered amorphous to eliminate lattice mismatch with the substrate crystal. After the amorphous buffer layer is formed, it is gradually converted into a crystalline layer to fabricate a light-emitting device while keeping the lattice match with the gallium nitride phosphide-based light-emitting part.

Refinement of the group-III nitride semiconductor layer constituting the stacked layer structure is influenced by the quality of the buffer layer, since the lattice constant of the buffer layer and the lattice constant of group-III nitride based light-emitting layer can be approximated as close as possible by controlling the composition of the buffer layer. As the lattice mismatch is smaller, a good epitaxial crystal layer with reduced crystal defects can be more readily obtained, thereby contributing to the high-luminous intensity emission of the light-emitting device. If the buffer layer or the group-III nitride semiconductor layer contains too many defects, such as dislocations and particles, lighting efficiency and lifetime of the light-emitting device are reduced. In order to remove particles, nitrogen is usually introduced to clean the surface of the buffer layer. However, the surface of the buffer layer can be corrosiond by nitrogen. Although the particles are removed, still other defects, such as pin holes, occur on the surface of the buffer layer.

SUMMARY OF THE INVENTION

Accordingly, an object of the present invention is to provide a method of forming a group-III nitride semiconductor layer on a light-emitting device that comprises a surface treatment of the buffer layer to protect the buffer layer from corrosion and remove particles therefrom.

It is a further object of the present invention to provide a method of forming a pure group-III nitride semiconductor layer without dislocations on a light-emitting device to enhance lighting efficiency.

It is still another object of the present invention to provide a method of forming a pure group-III nitride semiconductor layer without dislocations on a light-emitting device to prolong lifetime.

The key feature of the present invention is hydrogen treatment on the buffer to prevent corrosion during subsequent process and remove particles therefrom, allowing enhanced structure for the epitaxy layer following its formation on the buffer layer.

To achieve these and other advantages, the invention provides a method of forming a group-III nitride semiconductor layer on a light-emitting device. First, a substrate is provided, and a buffer layer is formed thereon. A hydrogen treatment is performed on the buffer layer. Finally, a group-III nitride semiconductor layer is formed on the buffer layer.

Alternatively, according to the present invention, the substrate is removed before the hydrogen treatment.

The group-III nitride semiconductor, comprising at least a first cladding layer, an active layer, and a second cladding layer is subsequently formed on the buffer layer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

First Embodiment

Figure 1:
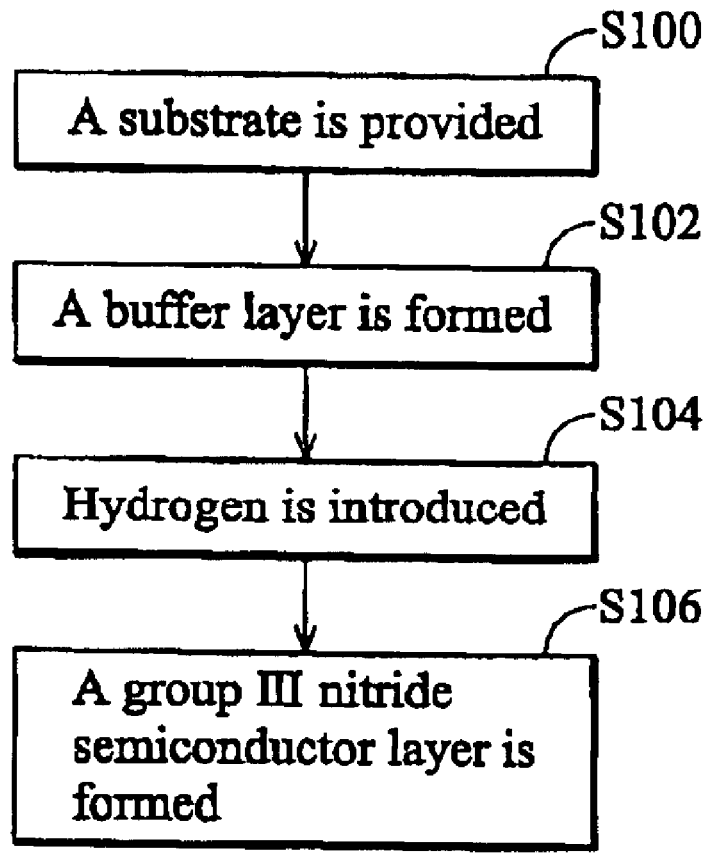
FIG. 1 is a flowchart of the method according to a preferred embodiment of the present invention.
Figure 2:
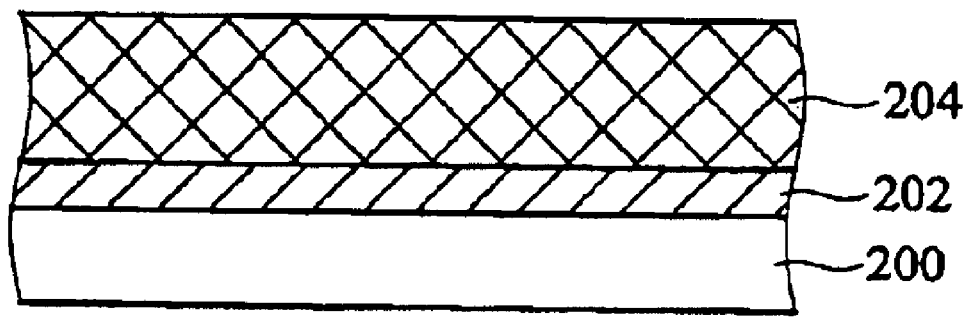
FIG. 2 is a cross-section showing the method according to a preferred embodiment of the present invention.

A preferred embodiment of the present invention is now described with reference to FIG. 1 and FIG. 2.

First, in step S100, a substrate 200 comprising silicon single crystal, SiC, or GaN is provided, silicon single crystal having a plane azimuth of {100} or {111} being preferred. The thickness of the substrate 200 is about 2~8 μm, preferably 3~6 μm.

Next, in step S102, a buffer layer 202 comprising boron phosphide (BP) is preferably formed on the substrate 200 by metalorganic chemical vapor deposition (MOCVD) using precursors comprising a combination of $BCl_3$ and $PCl_3$ or a combination of $BCl_3$ and $PH_3$. By virtue of this good lattice matching, the buffer layer provides an upper layer with reduced crystal defects, such as dislocation, and having excellent crystalinity.

The preferred embodiment of forming the BP buffer layer 202 is described below.

First, the temperature of the reactive chamber housing the substrate 200 is brought to about 900~1180° C. for one minute. Next, after the temperature of the reactive chamber is lowered to about 380° C., $PCl_3$ or $PH_3$ is introduced. Three minutes later, $BCl_3$ is introduced into the chamber for 40 min, and the temperature of the chamber is maintained at about 380° C. for 5 min. Then, the temperature of the chamber is brought to about 1030° C., and $BCl_3$ is introduced into the chamber again for 60 min. $PCl_3$ or $PH_3$ is continually supplied. Finally, the reactive gas comprising $PCl_3$ or $PH_3$ and $BCl_3$ has its supply terminated, and the temperature of the chamber is maintained at about 1030° C. for 10 min. The buffer layer 202 is formed on the substrate 200. After decreasing the temperature of the chamber to room temperature, the BP buffer layer 202 is formed. Throughout the entire process, hydrogen is continually introduced into the chamber.

In step S104, a hydrogen treatment is performed at about 350~500° C. to remove particles from the buffer layer 202 without damage or corrosion.

In step S106, a group-III nitride semiconductor layer 204 is formed by MOCVD on the buffer layer 202. The group-III nitride semiconductor layer 204 comprises $Al_xIn_{1-x}Ga_yN_{1-y}$ ($0<=x<=1, 0<=y<=1$) or $Al_xGa_{1-x}N_yP_{1-y}$ ($0<=x<=1, 0<=y<=1$), for example, GaN, InGaN, AlGaN, and GaNP. The precursors comprise methyl hydrazine or $NH_3$. When the precursors comprise monomethyl hydrazine (MMH) and trimethyl gallium (TMG), GaN can be formed. The thickness of the group-III nitride semiconductor layer 204 is about 1~30 μm, preferably 2~4 μm.

GaN formation is described herein as an example.

First, hydrogen, nitrogen and MMH are introduced into the chamber housing the substrate 200 having the buffer layer 202 at about 350~500° C. After 3 min, TMG is introduced into the chamber for about 20 min. 5 min later, the temperature of the chamber is brought to about 820° C. TMG is introduced into the chamber again for 60 min at about 820° C. Throughout the entire process, MMH is continuously introduced. Finally, the temperature of the chamber is maintained at about 820° C. for 30 min after stopping to introduce MMH and TMG. After decreasing the temperature of the chamber to room temperature, the process of forming the GaN semiconductor layer 204 is accomplished.

The stacked group-III nitride semiconductor 204 comprising at least a first cladding layer, an active layer, and a second cladding layer is formed subsequently.

The light-emitting layer further comprises a window layer and a pair of electrodes. A surface ohmic electrode can be provided on the surface of the group-III nitride semiconductor layer 204 serving as a contact layer. In a p-type contact layer, the surface ohmic electrode can be composed of a zinc(Zn)-containing alloy, such as indium zinic (InZn) and a gold beryllium (AuBe) alloy. These metals form a good ohmic contact with the group-III nitride semiconductor layer 204. For the pad electrode, a metal having a small electric resistance, such as gold (Au) and aluminum (Al), is preferably used. The surface ohmic electrode disposed in the periphery of the pad electrode on the surface of the group-III nitride semiconductor crystal layer 204 comprising a first cladding layer, an active layer, and a second cladding layer allows the device operating current supplied through a window layer from the pad electrode on the window layer to diffuse over a wide range of the light-emitting layer.

Second Embodiment

Figure 3:
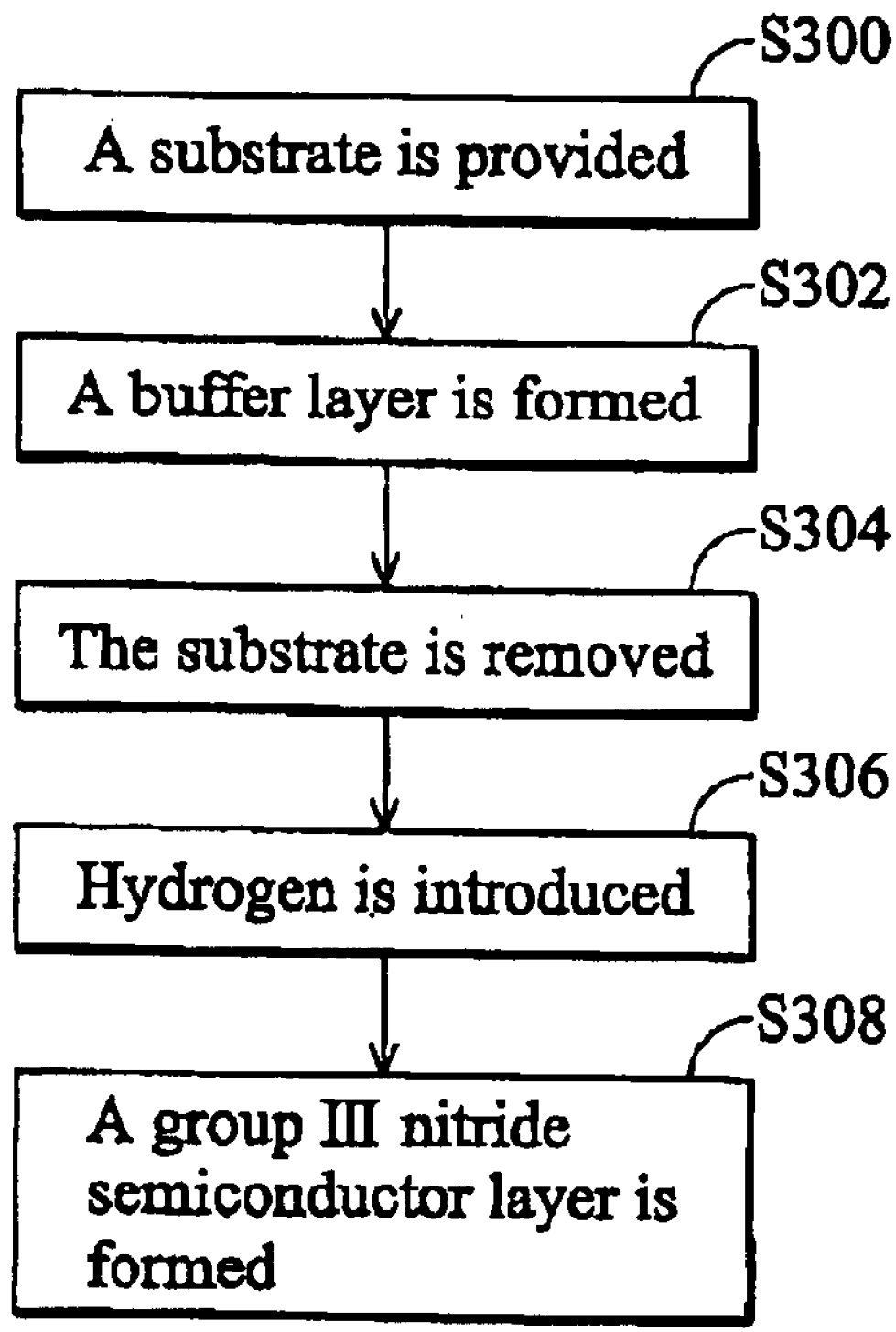
FIG. 3 is a flowchart of the method according to another preferred embodiment of the present invention.

A preferred embodiment of the present invention is now described with reference to FIG. 3 and FIG. 4.

Figure 4A:
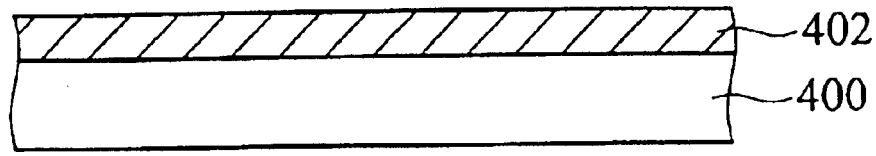
FIGS. 4A through 4C are cross-sections showing the method according to a preferred embodiment of the present invention.

First, in step S300, a substrate 400 comprising silicon single crystal, SiC, or GaN is provided, as shown in FIG. 4A, preferably a silicon single crystal having a plane azimuth of {100} or {111}. The thickness of the substrate 400 is about 2~8 μm, preferably 3~6 μm.

Next, in step S302, a buffer layer 402 comprising boron phasphide (BP) is preferably formed on the substrate 400 by metalorganic chemical vapor deposition (MOCVD) using precursors comprising a combination of $BCl_3$ and $PCl_3$ or a combination of $BCl_3$ and $PH_3$. By virtue of this good lattice matching, the buffer layer provides an upper layer with reduced crystal defects, such as dislocation, and having excellent crystallinity.

The preferred embodiment of forming the BP buffer layer 402 is described below.

First, the temperature of the reactive chamber housing the substrate 400 is brought to about 900~1180° C. for one minute. Next, after the temperature of the reactive chamber is lowered to about 380° C., $PCl_3$ or $PH_3$ is introduced into the chamber. Three minutes later, $BCl_3$ is introduced into the chamber for 40 min, and the temperature of the chamber is maintained at about 380° C. for 5 min. Then, the temperature of the chamber is brought to about 1030° C., and $BCl_3$ is introduced again for 60 min at about 1030° C. $PCl_3$ or $PH_3$ is continually supplied. Finally, the reactive gas comprising $PCl_3$ or $PH_3$ and $BCl_3$ has its supply terminated, and the temperature of the chamber is maintained at about 1030° C. for 10 min. The buffer layer 402 is formed on the substrate 400. After decreasing the temperature of the chamber to room temperature, the BP buffer layer 402 is formed. Throughout the entire process, hydrogen is continuously introduced.

Figure 4B:

In step S304, the substrate 400 is preferably removed by a suitable acid solution, such as HF solution, laser heatig, or polishing, as shown in FIG. 4B.

In step S306, a hydrogen treatment is performed at about 350~500° C. to remove particles from the buffer layer 402 without damage or corrosion.

Figure 4C:
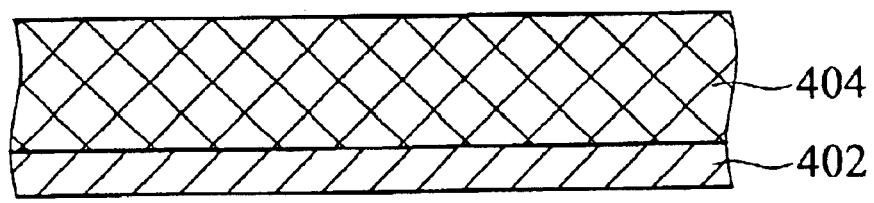

In, step S308, a group-III nitride semiconductor layer 404 is formed by MOCVD on the buffer layer 402, as shown in FIG. 4C. The group-III nitride semiconductor layer 404 comprises $Al_xIn_{1-x}Ga_yN_{1-y}$ ($0<=x<=1, 0<=y<=1$) or $Al_xGa_{1-x}N_yP_{1-y}$ ($0<=x<=1, 0<=y<=1$), for example, GaN, InGaN, AlGaN, and GaNP. The precursors comprise methyl hydrazine or $NH_3$. When the precursors comprise monomethyl hydrazine (MMH) and trimethyl gallium (TMG), GaN can be formed. The thickness of the group-III nitride semiconductor layer 404 is about 1~30 μm, preferably 2~4 μm.

GaN formation is consistent with the description outlined in the previous embodiment.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method of forming a group-III nitride semiconductor layer on a light-emitting device, comprising:

providing a substrate;

forming a buffer layer on the substrate;

performing a hydrogen treatment on the buffer layer for the surfaces treatment of the buffer layer to protect the buffer layer from corrosion and removing particles therefrom; and forming a group-III nitride semiconductor layer on the buffer layer.

2. The method as claimed in claim 1, wherein the substrate comprises Si.

3. The method as claimed in claim 1, wherein the buffer comprises BP.

4. The method as claimed in claim 3, wherein the precursors of the BP formation comprise a combination of $BCl_3$ and $PCl_3$ or a combination of $BCl_3$ and $PH_3$.

5. The method as claimed in claim 1, wherein the buffer layer is formed by epitaxy.

6. The method as claimed in claim 1, wherein the group-III nitride semiconductor layer comprises AlxInl-xGayNl-y (0<=x<=1,0<=y<=1) or AlxGal-xNyPl-y (0<=x<=1,0<=y<=1).

7. The method as claimed in claim 1, wherein the precursors of group-III nitride semiconductor layer comprise methyl hydrazine and ammonia ($NH_3$).

8. The method as claimed in claim 1, wherein the precursors of group-III nitride semiconductor layer comprise monomethyl hydrazine (MMH) and trimethyl gallium (TMG).

9. The method as claimed in claim 1, wherein the group-III nitride semiconductor layer is formed by epitaxy.

10. The method as claimed in claim 1, wherein the hydrogen treatment is performed at about 350~500° C.

11. A method of forming a group-III nitride semiconductor layer on a light-emitting device, comprising:

providing a substrate;

forming a buffer layer on the substrate;

removing the substrate;

performing a hydrogen treatment on the buffer layer for the surfaces treatment of the buffer layer to protect the buffer layer from corrosion and removing particles therefrom; and forming a group-III nitride semiconductor layer on the buffer layer.

12. The method as claimed in claim 11, wherein the substrate comprises Si.

13. The method as claimed in claim 11, wherein the buffer comprises BP.

14. method as claimed in claim 13, wherein the precursors of the BP formation comprise a combination of $BCl_3$ and $PCl_3$ or a combination of $BCl_3$ and $PH_3$.

15. The method as claimed in claim 11, wherein the buffer layer is formed by epitaxy.

16. The method as claimed in claim 11, wherein the group-III nitride semiconductor layer comprises AlxInl-xGayNl-y (0<=x<=1,0<=y<=1) or AlxGal-xNyPl-y (0<=x<=1,0<=y<=1).

17. The method as claimed in claim 11, wherein the precursors of group-III nitride semiconductor layer comprise methyl hydrazine and ammonia ($NH_3$).

18. The method as claimed in claim 11, wherein the precursors of group-III nitride semiconductor layer comprise monomethyl hydrazine (MMH) and trimethyl gallium (TMG).

19. The method as claimed in claim 11, wherein the group-III nitride semiconductor layer is formed by epitaxy.

20. The method as claimed in claim 11, wherein the hydrogen treatment is performed at about 350~500° C.

* * * * *